(12) United States Patent
Felton et al.

(10) Patent No.: US 9,357,666 B1
(45) Date of Patent: May 31, 2016

(54) FIELD-SERVICEABLE IT DEVICE

(71) Applicant: EMC Corporation, Hopkinton, MA (US)

(72) Inventors: Mickey S. Felton, Sterling, MA (US); Ralph C. Frangioso, Franklin, MA (US); Michael Gregoire, Waltham, MA (US)

(73) Assignee: EMC Corporation, Hopkinton, MA (US)

( * ) Notice: Subject to any disclaimer, the term of this patent is extended or adjusted under 35 U.S.C. 154(b) by 141 days.

(21) Appl. No.: 14/042,504

(22) Filed: Sep. 30, 2013

(51) Int. Cl.
*G06F 1/16* (2006.01)
*H05K 7/10* (2006.01)

(52) U.S. Cl.
CPC .................................. *H05K 7/10* (2013.01)

(58) Field of Classification Search
CPC ................................... G06F 1/187; G06F 1/16

USPC ............................................. 361/679.31, 686
See application file for complete search history.

(56) References Cited

U.S. PATENT DOCUMENTS

| | | | |
|---|---|---|---|
| 6,523,918 B1 * | 2/2003 | Baiza ......................... | 312/265.1 |
| 6,924,986 B1 * | 8/2005 | Sardella et al. ............... | 361/785 |
| 2003/0019824 A1 * | 1/2003 | Gray ................................ | 211/26 |
| 2004/0188362 A1 * | 9/2004 | Liu et al. .......................... | 211/26 |
| 2010/0296236 A1 * | 11/2010 | Schuette .................. | 361/679.31 |
| 2011/0261526 A1 * | 10/2011 | Atkins et al. ............. | 361/679.33 |
| 2012/0104200 A1 * | 5/2012 | Grady et al. .............. | 248/222.14 |
| 2013/0077218 A1 * | 3/2013 | Zhang et al. .............. | 361/679.02 |
| 2013/0107424 A1 * | 5/2013 | Thomas et al. .......... | 361/679.01 |

* cited by examiner

*Primary Examiner* — Forrest M Phillips
(74) *Attorney, Agent, or Firm* — Brian J. Colandreo; Mark H. Whittenberger; Holland & Knight LLP

(57) ABSTRACT

An IT device includes a system board, a drive controller system, a mid-plane assembly, a bridge connector assembly configured to releasably couple the system board and the drive controller system, and a second connector assembly configured to releasably couple the drive controller system and the mid-plane assembly.

24 Claims, 5 Drawing Sheets

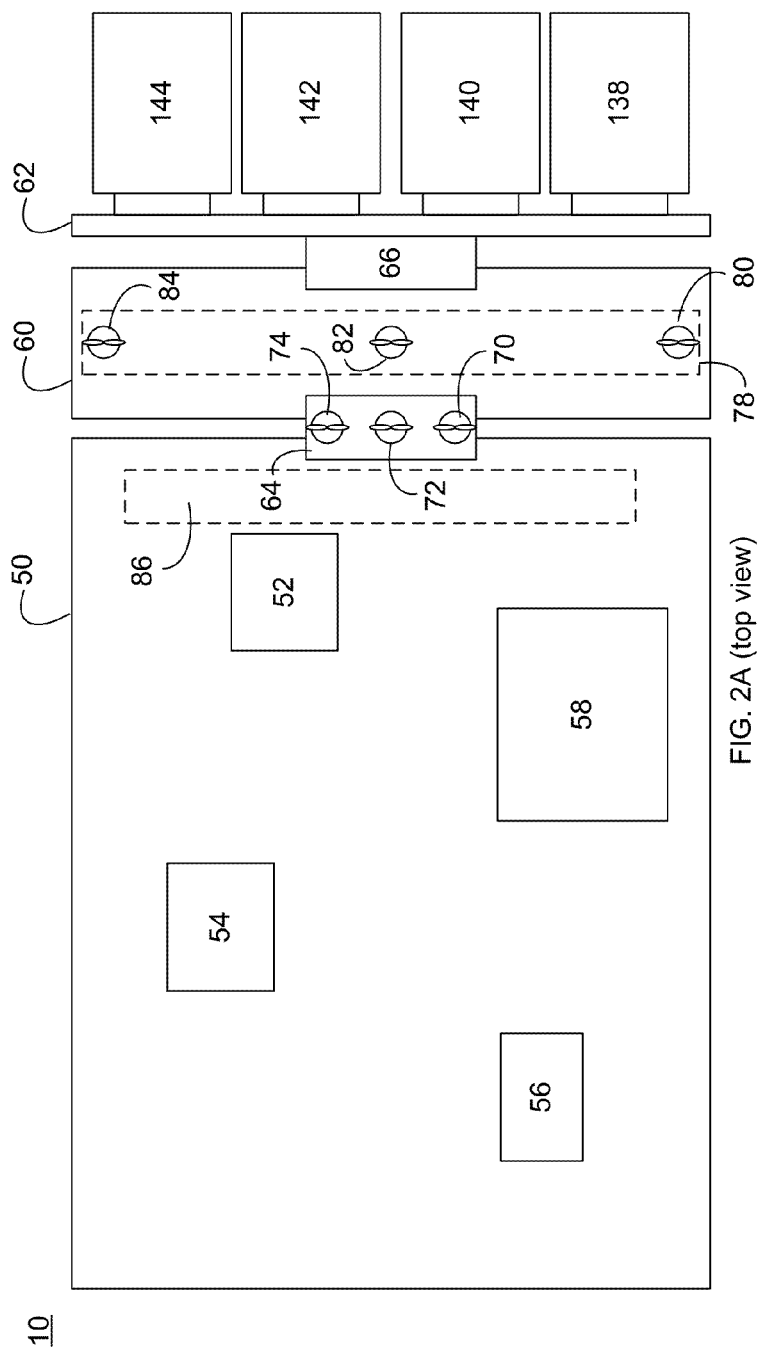
FIG. 2A (top view)
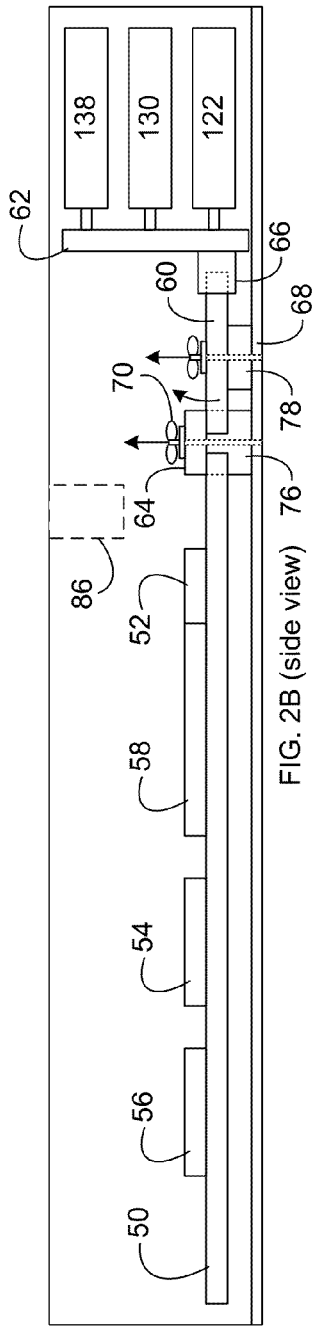
FIG. 2B (side view)

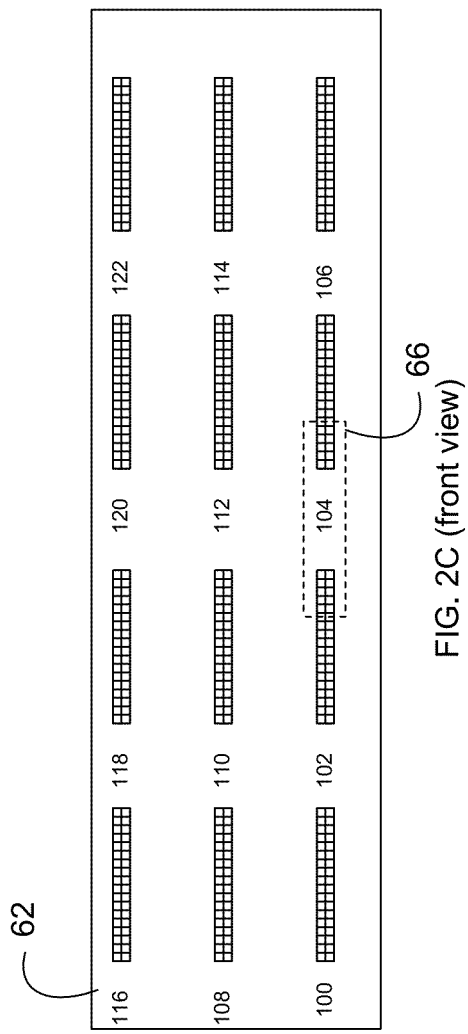
FIG. 2C (front view)
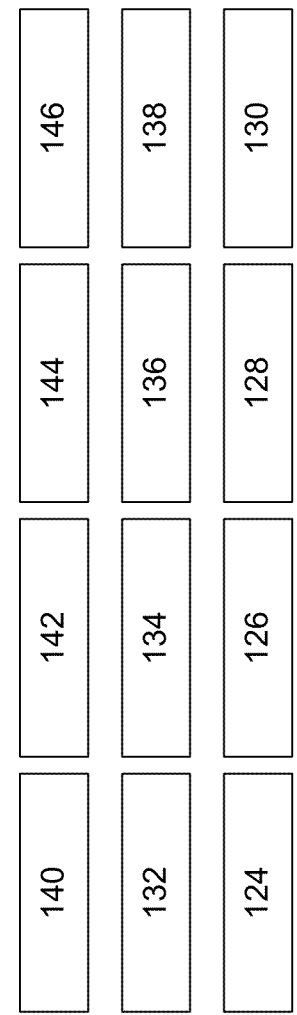
FIG. 2D (front view)

FIELD-SERVICEABLE IT DEVICE

TECHNICAL FIELD

This disclosure relates to system boards and, more particularly, to system boards that are field serviceable by consumers.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

When designing such high availability devices, flexibility concerning the manner in which these devices are serviced is highly important, wherein high availability devices that are serviceable by the consumer tend to be more desirable than devices that require specialized training/tools for service.

SUMMARY OF DISCLOSURE

In one implementation, an IT device includes a system board, a drive controller system, a mid-plane assembly, a bridge connector assembly configured to releasably couple the system board and the drive controller system, and a second connector assembly configured to releasably couple the drive controller system and the mid-plane assembly.

One or more of the following features may be included. The bridge connector assembly may be configured to be releasably coupled to an enclosure of the IT device. The bridge connector assembly may include one or more screw assemblies for releasably coupling the bridge connector assembly to the enclosure of the IT device. The one or more screw assemblies may include one or more thumbscrew assemblies. The bridge connector assembly may include a spacer assembly for positioning the bridge connector assembly with respect to the enclosure of the IT device. The drive controller system may include a spacer assembly for positioning the drive controller assembly with respect to the enclosure of the IT device. The system board may include a first conductor pad array and the drive controller system includes a second conductor pad array. The bridge connector assembly may include: a first set of solderless connectors for electrically engaging the first conductor pad array on the system board; and a second set of solderless connectors for electrically engaging the second conductor pad array on the drive controller system. The bridge connector assembly may be configured to span the system board and the drive controller system. The IT device may be configured for use in a high availability storage system.

In another implementation, an IT device includes a system board, a drive controller system, a mid-plane assembly, a bridge connector assembly configured to span the system board and the drive controller system and releasably couple the system board and the drive controller system, wherein the bridge connector assembly is configured to be releasably coupled to an enclosure of the IT device. A second connector assembly is configured to releasably couple the drive controller system and the mid-plane assembly.

One or more of the following features may be included. The bridge connector assembly may include one or more screw assemblies for releasably coupling the bridge connector assembly to the enclosure of the IT device. The one or more screw assemblies may include one or more thumbscrew assemblies. The bridge connector assembly may include a spacer assembly for positioning the bridge connector assembly with respect to the enclosure of the IT device. The drive controller system may include a spacer assembly for positioning the drive controller assembly with respect to the enclosure of the IT device. The system board may include a first conductor pad array and the drive controller system may include a second conductor pad array. The bridge connector assembly may include: a first set of solderless connectors for electrically engaging the first conductor pad array on the system board; and a second set of solderless connectors for electrically engaging the second conductor pad array on the drive controller system. The IT device may be configured for use in a high availability storage system.

In another implementation, an IT device includes a system board having a first conductor pad array, a drive controller system having a second conductor pad array, a mid-plane assembly, a bridge connector assembly configured to releasably couple the system board and the drive controller system, wherein the bridge connector assembly includes: a first set of solderless connectors for electrically engaging the first conductor pad array on the system board, and a second set of solderless connectors for electrically engaging the second conductor pad array on the drive controller system. A second connector assembly is configured to releasably couple the drive controller system and the mid-plane assembly.

One or more of the following features may be included. The bridge connector assembly may be configured to be releasably coupled to an enclosure of the IT device. The bridge connector assembly may include one or more screw assemblies for releasably coupling the bridge connector assembly to the enclosure of the IT device. The one or more screw assemblies may include one or more thumbscrew assemblies. The bridge connector assembly may include a spacer assembly for positioning the bridge connector assembly with respect to the enclosure of the IT device. The drive controller system may include a spacer assembly for positioning the drive controller assembly with respect to the enclosure of the IT device.

The details of one or more implementations are set forth in the accompanying drawings and the description below. Other features and advantages will become apparent from the description, the drawings, and the claims.

BRIEF DESCRIPTION OF THE DRAWINGS

FIGS. 2A & 2B are diagrammatic views of a system board, drive controller system, and mid-plane assembly included within the IT device of FIG. 1;

FIG. 2C is a diagrammatic view of the mid-plane assembly of FIGS. 2A & 2B;

FIG. 2D is a diagrammatic view of a drive array for electrically coupling to the mid-plane assembly of FIGS. 2A, 2B & 2C;

Like reference symbols in the various drawings indicate like elements.

DETAILED DESCRIPTION OF THE PREFERRED EMBODIMENTS

Figure 1:
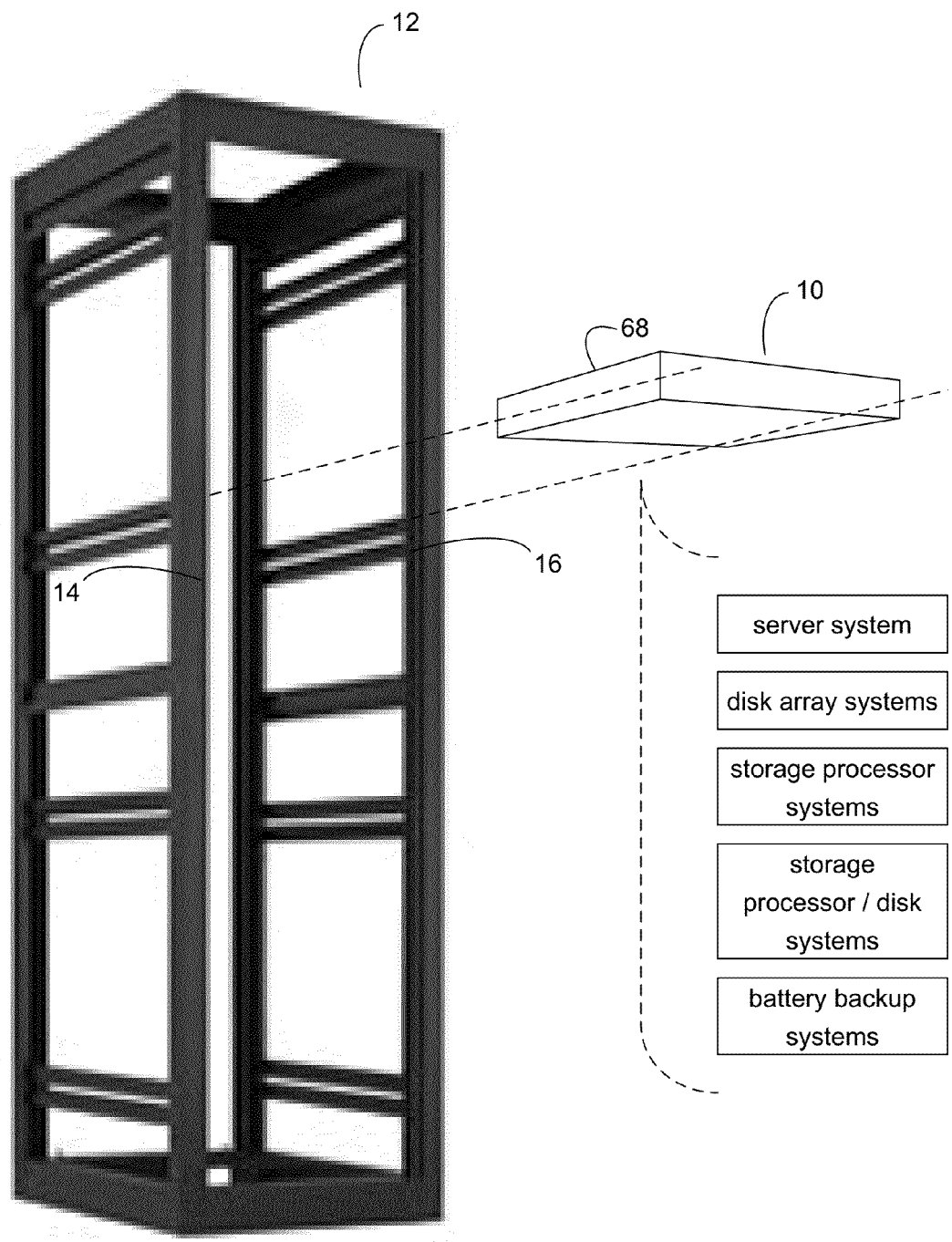
FIG. 1 is a perspective view of an IT rack and an IT device.

Referring to FIG. 1, IT devices (e.g., IT device 10) may be utilized by organizations to process and store data. Examples of IT device 10 may include but are not limited to the various components of high-availability storage systems, such as: server systems, disk array systems, storage processor systems, storage processor/disk systems, and battery backup systems.

IT racks (e.g., IT rack 12) may be utilized to store and organize these IT devices (e.g., IT device 10). For example, IT rack 12 may be placed within a computer room and various IT devices may be attached to rails (e.g., NEMA rails 14, 16) included within IT rack 12, wherein these rails (e.g., NEMA rails 14, 16) may have a standard and defined spacing between them (e.g., 19"). Typically, IT devices that are configured to fit within IT rack 12 may be described as rack-mountable IT devices. Alternatively. IT device 10 may be a free-standing device that does not require an IT rack for mounting.

Referring also to FIGS. 2A, 2B, 2C & 2D, positioned within IT device 10 may be one or more system boards (e.g., system board 50) that may include a plurality of circuits 52, 54, 56, 58, examples of which may include but are not limited to one or more microprocessors, memory circuits, voltage regulator circuits, and memory controller circuits.

IT device 10 may include a drive controller system (e.g., drive controller system 60) that may be electrically coupled to system board 50. A mid-plane assembly (e.g., mid-plane assembly 62) may be electrically coupled to drive controller system 60.

Mid-plane assembly 62 may include a plurality of drive connectors (e.g., drive connectors 100, 102, 104, 106, 108, 110, 112, 114, 116, 118, 120, 122) that are configured to electrically couple mid-plane assembly 62 to a plurality of disk drives (e.g., disk drives 124, 126, 128, 130, 132, 134, 136, 138, 140, 142, 144, 146 respectively), Disk drives 124, 126, 128, 130, 132, 134, 136, 138, 140, 142, 144, 146 may be hot-swappable disk drives that may be coupled to and/or decoupled from mid-plane assembly 62 during the operation of IT device 10. While, in this example, mid-plane assembly 62 is shown to accommodate twelve disk drives, this is for illustrative purposes only, as the actual number of disk drives may be increased/decreased based upon design criteria.

While, in this example, drive controller system 60 and mid-plane assembly 62 are shown to be unitary components, this is for illustrative purposes only, as other configurations are possible and are considered to be within the scope of this disclosure. For example, if disk drives 124, 126, 128, 130, 132, 134 are SATA drives and disk drives 136, 138, 140, 142, 144, 146 are SAS drives, mid-plane assembly 62 may be compartmentalized into two separate portions, a first portions for SATA disk drives 124, 126, 128, 130, 132, 134 and a second portion for SAS disk drives 136, 138, 140, 142, 144, 146.

Further and in such a configuration, drive controller system 60 may be compartmentalized into two separate portions, a first portion of drive controller system 60 being a SATA drive controller for accessing SATA disk drives 124, 126, 128, 130, 132, 134 and a second portion of drive controller system 60 being a SAS drive controller for accessing SAS disk drives 136, 138, 140, 142, 144, 146. While SAS and SATA drives are discussed above, this is for illustrative purposes only, as other configurations are possible and are considered to be within the scope of this disclosure. For example, IT device 10 and drive controller system 60 may be configured to utilize other types of drives, examples of which may include but are not limited to PCIe solid-state disk drives.

IT device 10 may include bridge connector assembly 64 configured to releasably couple system board 50 and drive controller system 60. Bridge connector assembly 64 may be configured to span system board 50 and drive controller system 60. IT device 10 may further include second connector assembly 66 configured to releasably couple drive controller system 60 and mid-plane assembly 62. If IT device 10 includes two of more drive controller systems (as described above), IT device 10 may include two or more bridge connector assemblies (e.g., one for each of the drive controller systems).

Bridge connector assembly 64 may be configured to be releasably coupled to an enclosure (e.g., enclosure 68) of IT device 10. Bridge connector assembly 64 may include one or more screw assemblies (such as thumbscrew assemblies 70, 72, 74) for releasably coupling bridge connector assembly 64 to enclosure 68 of IT device 10. Bridge connector assembly 64 may allow for a reduction in the number of cables included within IT device 10, which may result in lowering the cost of IT device 10 and allowing for enhanced cooling and serviceability of IT device 10.

While bridge connector assembly 64 is described above as utilizing thumbscrew assemblies 70, 72, 74, this is for illustrative purposes only, as other configurations are possible and are considered to be with the scope of this disclosure. For example, various other toolless fasteners may be utilized. Bridge connector assembly 64 may include spacer assembly 76 for positioning bridge connector assembly 64 with respect to enclosure 68 of IT device 10.

Drive controller system 60 may include spacer assembly 78 for positioning drive controller assembly 60 with respect to enclosure 68 of IT device 10. Drive controller system 60 may also be configured to be releasably coupled to enclosure 68 of IT device 10. Drive controller system 60 may include one or more screw assemblies (such as thumbscrew assemblies 80, 82, 84) for releasably coupling drive controller system 60 to enclosure 68 of IT device 10.

Figure 3:
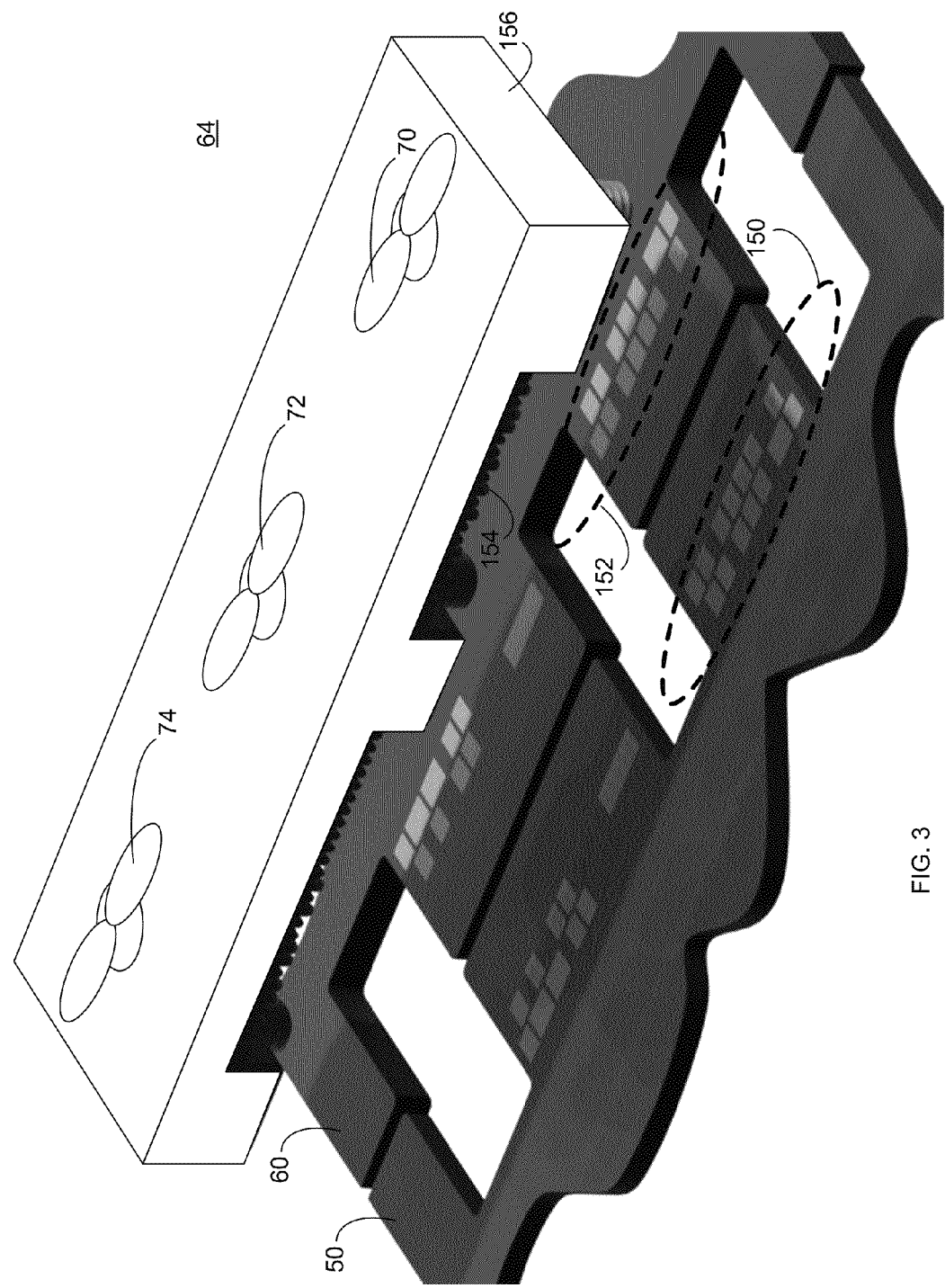
FIG. 3 is an isometric view of a bridge connector assembly of the IT device of FIG. 1.

Referring also to FIG. 3, one implementation of bridge connector assembly 64 is shown. System board 50 may include a first conductor pad array (e.g., first conductor pad array 150) and drive controller system 60 may include a second conductor pad array (e.g., second conductor pad array 152). Bridge connector assembly 64 may include a first set of solderless connectors (e.g., first connectors 154) for electrically engaging first conductor pad array 150 on system board 50. Bridge connector assembly 64 may further include second set of solderless connectors (e.g., second connectors 156, view obscured by bridge connector assembly 64) for electrically engaging second conductor pad array 152 on drive controller system 60. Bridge connector assembly 64 may include internal conductors (not shown) for electrically coupling first connectors 154 and second connectors 156, thus electrically coupling system board 50 and drive controller system 60

Figure 4A:
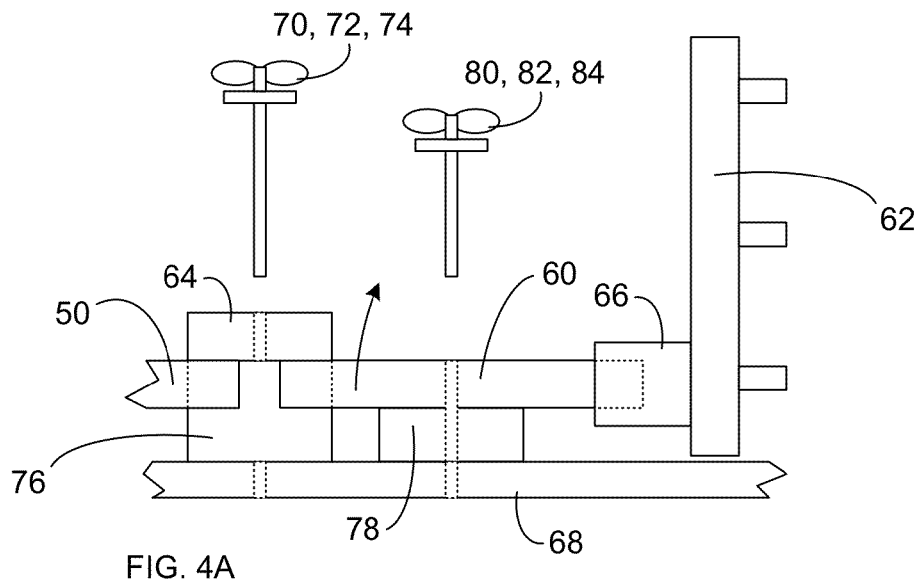
FIGS. 4A, 4B & 4C are diagrammatic views illustrating the process of removing the drive controller system of FIGS. 2A & 2B from the IT device of FIG. 1.
Figure 4B:
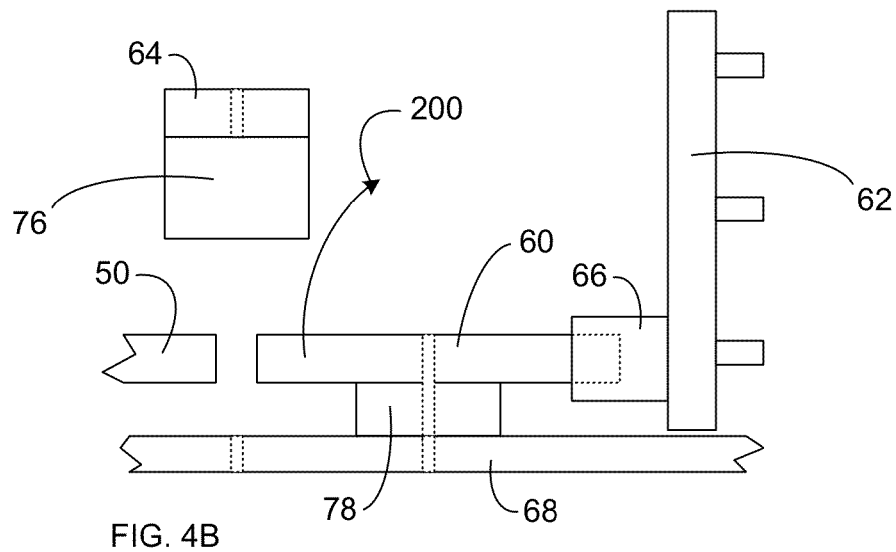
Figure 4C:
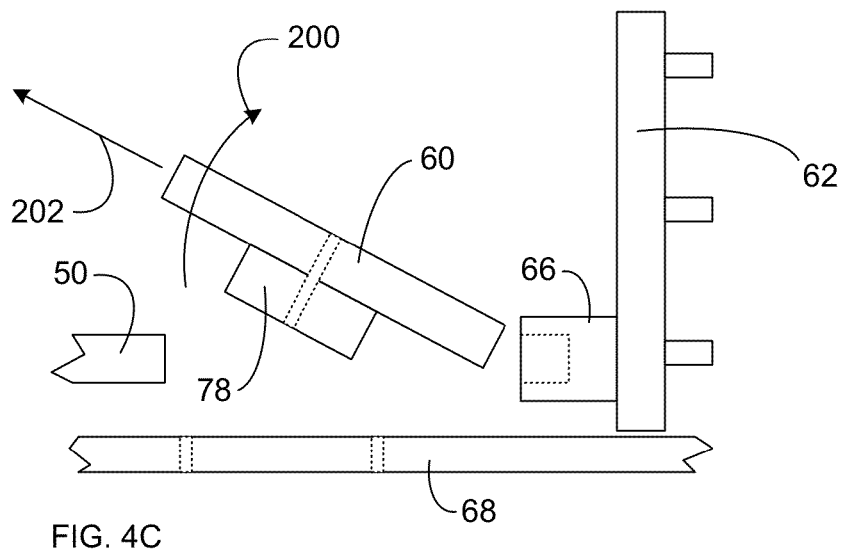

Referring also to FIGS. 4A, 4B & 4C, bridge connector assembly 64 may be configured to allow for the removal of drive controller system 60 without needing to also remove either system board 50 or mid-plane assembly 62. Specifically and as shown in FIG. 4A, thumbscrew assemblies 70, 72, 74 may first be removed from bridge connector assembly 64, thus releasing bridge connector assembly 64 from enclosure 68 of IT device 10. Bridge connector assembly 64 may then be lifted upward (as shown in FIG. 5B). Thumbscrew assemblies 80, 82, 84 may then be removed from drive controller system 60 (thus releasing drive controller system 60 from enclosure 68 of IT device 10), and drive controller system 60 may be rotated (in the direction of arrow 200) until spacer 78 of drive controller system 60 is clear of system board 50, at which point drive controller system 60 may be slid (in the direction of arrow 202) to disengage drive controller system 60 from mid-plane assembly 62.

IT device 10 may include one or more fan assemblies (e.g., fan assembly 86, FIGS. 2A & 2B) positioned proximate bridge connector assembly 64. If IT device 10 is configured in such a fashion, fan assembly 86 may need to be removed prior to beginning the above-described process of removing drive controller system 60 from IT device 10.

Having thus described the disclosure of the present application in detail and by reference to embodiments thereof, it will be apparent that modifications and variations are possible without departing from the scope of the disclosure defined in the appended claims.

What is claimed is:

1. An IT device comprising:
a system board;
a drive controller system;
a mid-plane assembly;
a bridge connector assembly configured to releasably couple the system board and the drive controller system via a toolless fastener; and
a second connector assembly configured to releasably couple the drive controller system and the mid-plane assembly.

2. The IT device of claim 1 wherein the bridge connector assembly is configured to be releasably coupled to an enclosure of the IT device.

3. The IT device of claim 2 wherein the bridge connector assembly includes one or more screw assemblies for releasably coupling the bridge connector assembly to the enclosure of the IT device.

4. The IT device of claim 3 wherein the one or more screw assemblies include one or more thumbscrew assemblies.

5. The IT device of claim 2 wherein the bridge connector assembly includes a spacer assembly for positioning the bridge connector assembly with respect to the enclosure of the IT device.

6. The IT device of claim 2 wherein the drive controller system includes a spacer assembly for positioning the drive controller assembly with respect to the enclosure of the IT device.

7. The IT device of claim 1 wherein the system board includes a first conductor pad array and the drive controller system includes a second conductor pad array.

8. The IT device of claim 7 wherein the bridge connector assembly includes:
a first set of solderless connectors for electrically engaging the first conductor pad array on the system board; and
a second set of solderless connectors for electrically engaging the second conductor pad array on the drive controller system.

9. The IT device of claim 1 wherein the bridge connector assembly is configured to span the system board and the drive controller system.

10. The IT device of claim 1 wherein the IT device is configured for use in a high availability storage system.

11. An IT device comprising:
a system board;
a drive controller system;
a mid-plane assembly;
a bridge connector assembly configured to span the system board and the drive controller system and releasably couple the system board and the drive controller system via a toolless fastener, wherein the bridge connector assembly is configured to be releasably coupled to an enclosure of the IT device; and
a second connector assembly configured to releasably couple the drive controller system and the mid-plane assembly.

12. The IT device of claim 11 wherein the bridge connector assembly includes one or more screw assemblies for releasably coupling the bridge connector assembly to the enclosure of the IT device.

13. The IT device of claim 12 wherein the one or more screw assemblies include one or more thumbscrew assemblies.

14. The IT device of claim 11 wherein the bridge connector assembly includes a spacer assembly for positioning the bridge connector assembly with respect to the enclosure of the IT device.

15. The IT device of claim 11 wherein the drive controller system includes a spacer assembly for positioning the drive controller assembly with respect to the enclosure of the IT device.

16. The IT device of claim 11 wherein the system board includes a first conductor pad array and the drive controller system includes a second conductor pad array.

17. The IT device of claim 16 wherein the bridge connector assembly includes:
a first set of solderless connectors for electrically engaging the first conductor pad array on the system board; and
a second set of solderless connectors for electrically engaging the second conductor pad array on the drive controller system.

18. The IT device of claim 11 wherein the IT device is configured for use in a high availability storage system.

19. An IT device comprising:
a system board including a first conductor pad array;
a drive controller system including a second conductor pad array;
a mid-plane assembly;
a bridge connector assembly configured to releasably couple the system board and the drive controller system via a toolless fastener, wherein the bridge connector assembly includes:
a first set of solderless connectors for electrically engaging the first conductor pad array on the system board, and
a second set of solderless connectors for electrically engaging the second conductor pad array on the drive controller system; and
a second connector assembly configured to releasably couple the drive controller system and the mid-plane assembly.

20. The IT device of claim 19 wherein the bridge connector assembly is configured to be releasably coupled to an enclosure of the IT device.

21. The IT device of claim 20 wherein the bridge connector assembly includes one or more screw assemblies for releasably coupling the bridge connector assembly to the enclosure of the IT device.

22. The IT device of claim 21 wherein the one or more screw assemblies include one or more thumbscrew assemblies.

23. The IT device of claim 20 wherein the bridge connector assembly includes a spacer assembly for positioning the bridge connector assembly with respect to the enclosure of the IT device.

24. The IT device of claim 20 wherein the drive controller system includes a spacer assembly for positioning the drive controller assembly with respect to the enclosure of the IT device.

* * * * *